United States Patent
Huang

(10) Patent No.: US 12,295,124 B2
(45) Date of Patent: May 6, 2025

(54) DUAL LIQUID PUMP LIQUID COOLING RADIATOR AND LIQUID COOLING HEAT DISSIPATION DEVICE

(71) Applicant: Tsung-Hsien Huang, I-Lan Hsien (TW)

(72) Inventor: Tsung-Hsien Huang, I-Lan Hsien (TW)

( * ) Notice: Subject to any disclaimer, the term of this patent is extended or adjusted under 35 U.S.C. 154(b) by 196 days.

(21) Appl. No.: 18/220,726

(22) Filed: Jul. 11, 2023

(65) Prior Publication Data
US 2024/0389275 A1 Nov. 21, 2024

(30) Foreign Application Priority Data

May 17, 2023 (TW) ................................ 112118342

(51) Int. Cl.
*H05K 7/20* (2006.01)

(52) U.S. Cl.
CPC ..... *H05K 7/20772* (2013.01); *H05K 7/20263* (2013.01); *H05K 7/20272* (2013.01); *H05K 7/20727* (2013.01)

(58) Field of Classification Search
CPC .......... H05K 7/20772; H05K 7/20263; H05K 7/20272; H05K 7/20727
USPC ....................................... 165/80.4
See application file for complete search history.

(56) References Cited

U.S. PATENT DOCUMENTS

| | | | | |
|---|---|---|---|---|
| 6,166,907 | A * | 12/2000 | Chien | F28D 1/0478 361/689 |
| 9,927,181 | B2 * | 3/2018 | Mounioloux | G06F 1/20 |
| 10,834,850 | B2 * | 11/2020 | Deng | F28D 1/05383 |
| 11,252,837 | B2 * | 2/2022 | Nakae | F28D 1/05366 |
| 11,363,740 | B2 * | 6/2022 | Deng | F28F 9/0258 |
| 11,624,559 | B2 * | 4/2023 | Huang | F28D 7/1615 165/173 |
| 11,920,879 | B2 * | 3/2024 | Tokeshi | F28D 1/05383 |
| 12,025,385 | B2 * | 7/2024 | Xiao | H01L 23/467 |
| 12,158,307 | B2 * | 12/2024 | Xiao | F28D 1/05375 |
| 2005/0180105 | A1 * | 8/2005 | Matsushima | H01L 23/473 257/E23.098 |
| 2009/0044929 | A1 * | 2/2009 | Yeh | F28D 15/00 165/104.19 |
| 2017/0115708 | A1 * | 4/2017 | Tivadar | G06F 1/20 |
| 2019/0075681 | A1 * | 3/2019 | Xiao | F28F 1/126 |
| 2019/0090384 | A1 * | 3/2019 | Xiao | F28F 1/126 |
| 2019/0104641 | A1 * | 4/2019 | Fan | G06F 1/20 |
| 2021/0385969 | A1 * | 12/2021 | Geng | G06F 1/20 |
| 2023/0156958 | A1 * | 5/2023 | Fan | H05K 7/20272 165/80.4 |
| 2024/0334645 | A1 * | 10/2024 | Huang | H05K 7/20254 |
| 2024/0381568 | A1 * | 11/2024 | Huang | F28D 1/05366 |

(Continued)

*Primary Examiner* — Claire E Rojohn, III
(74) *Attorney, Agent, or Firm* — Ying-Ting Chen; Law Office of Michael Chen

(57) ABSTRACT

The invention discloses a dual liquid pump liquid cooling radiator and a liquid cooling heat dissipation device. The dual liquid pump liquid cooling radiator includes two liquid boxes and a plurality of radiator pipe sets arranged side by side between the two liquid boxes. The interior of one liquid box is divided into a hot liquid chamber and a cold liquid chamber by an air heat insulation space, and a first liquid pump is installed therein. The interior of the other liquid box is divided into a hot liquid chamber and a cold liquid chamber by a liquid barrier, and a second liquid pump is installed therein.

8 Claims, 8 Drawing Sheets

(56) References Cited

U.S. PATENT DOCUMENTS

2024/0389275 A1* 11/2024 Huang ............... H05K 7/20272
2025/0035383 A1*  1/2025 Huang ................... F28F 13/12

* cited by examiner

DUAL LIQUID PUMP LIQUID COOLING RADIATOR AND LIQUID COOLING HEAT DISSIPATION DEVICE

BACKGROUND OF THE INVENTION (a) Field of the Invention

The present invention relates to liquid cooling heat dissipation device technology and more particularly to a dual liquid pump liquid cooling radiator and a liquid cooling heat dissipation device suitable for being installed in a server to cool its processor.

(b) Description of the Prior Art

The processors of today's servers are prone to heat during operation, and liquid cooling systems with better cooling efficiency must be used. A known liquid cooling heat dissipation system (such as shown in US20090044929) comprises a liquid cooling head, a liquid cooling radiator, a liquid pump, and liquid pipes connected between the liquid cooling head, the liquid cooling radiator and the liquid pump, forming a closed liquid circulation system. The liquid cooling radiator comprises a shunt box, a return box, and radiator pipes and fins connected between the shunt box and the return box. Usually, the inside of the shunt box is divided into a hot liquid chamber and a cold liquid chamber by a metal partition.

The radiator pipes of the above-mentioned known liquid cooling radiator are relatively short, and only a single liquid pump can be used to make the liquid flow inside the radiator pipes. However, the radiator pipes are relatively short, so that after the coolant flows through the radiator pipes, it will not be able to reduce the coolant to the ideal low temperature. If it is returned to the liquid cooling head, the cooling efficiency will be reduced and the coolant will accumulate heat. To solve this problem, it is necessary to increase the length of the radiator pipes and fins and the number of fans, so that the liquid has a longer process to flow and cool down in the radiator pipes. However, this will lead to insufficient cooling liquid flow in the pipes, and cause excessive load on a single liquid pump in the liquid cooling radiator, which is the primary problem to be solved by the present invention.

In addition, the above-mentioned hot liquid will conduct heat to the cold liquid in the cold liquid chamber through the metal partition when it is in the hot liquid chamber. Moreover, the space of the known hot liquid chamber is the same size as the cold liquid chamber, so that the hot liquid cannot quickly flow through the hot liquid chamber to the radiator pipes, causing the heat of the hot liquid to accumulate in the shunt box, and conduct heat to the front end of the entire liquid cooling radiator (including the front ends of the radiator pipes), so that the cooled liquid is heated again when it flows through.

SUMMARY OF THE INVENTION

The main purpose of the present invention is to provide a dual liquid pump liquid cooling radiator and liquid cooling heat dissipation device, where through the design of a first liquid box and a second liquid box of the dual liquid pump liquid cooling radiator, a first radiator pipe set and a second radiator pipe set connected between the first liquid box and the second liquid box and two liquid pumps respectively installed in the first liquid box and the second liquid box, the present invention enables the dual liquid pump liquid cooling radiator to increase the length of the radiator pipe sets and the number of fans, so as to improve the overall cooling efficiency, avoid the problems of flow reduction and single liquid pump overload caused by too long first radiator pipe set and second radiator pipe set.

The second object of the present invention is to provide a dual liquid pump liquid cooling radiator and liquid cooling heat dissipation device, where through the design of the air heat insulation space in the first liquid box of the dual liquid pump liquid cooling radiator, the heat of the hot liquid cannot be transferred to the cold liquid, and through the space design in the first liquid box, the hot liquid flowing into the first liquid box can quickly flow to the first radiator pipe set to dissipate heat, avoiding the stagnation of hot liquid and heat accumulation in the first liquid box, so as to prevent the heat transfer from the hot liquid in the first liquid box to the cold liquid and prevent heat accumulation in the first liquid box.

DETAILED DESCRIPTION OF THE PREFERRED EMBODIMENTS

Figure 1:
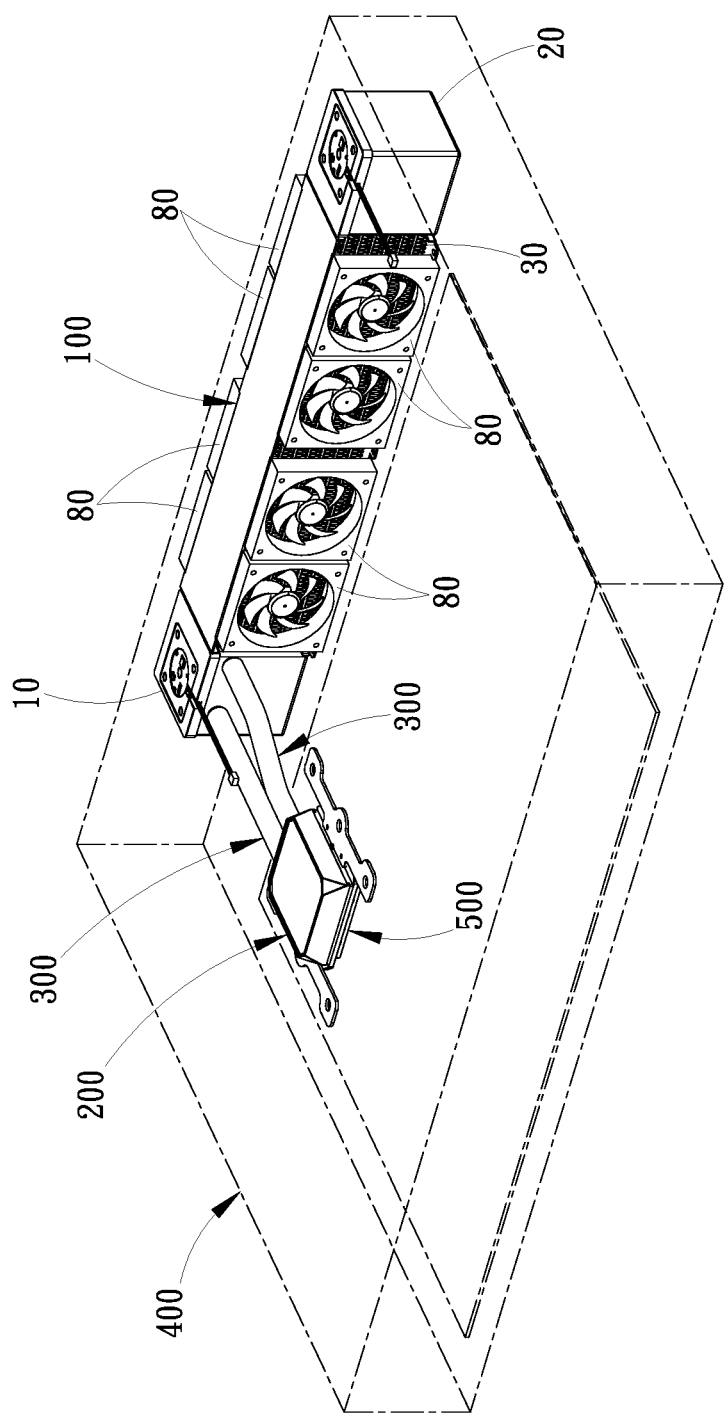
FIG. 1 is a schematic diagram of the liquid cooling heat dissipation device of the present invention installed on the server.
Figure 2:
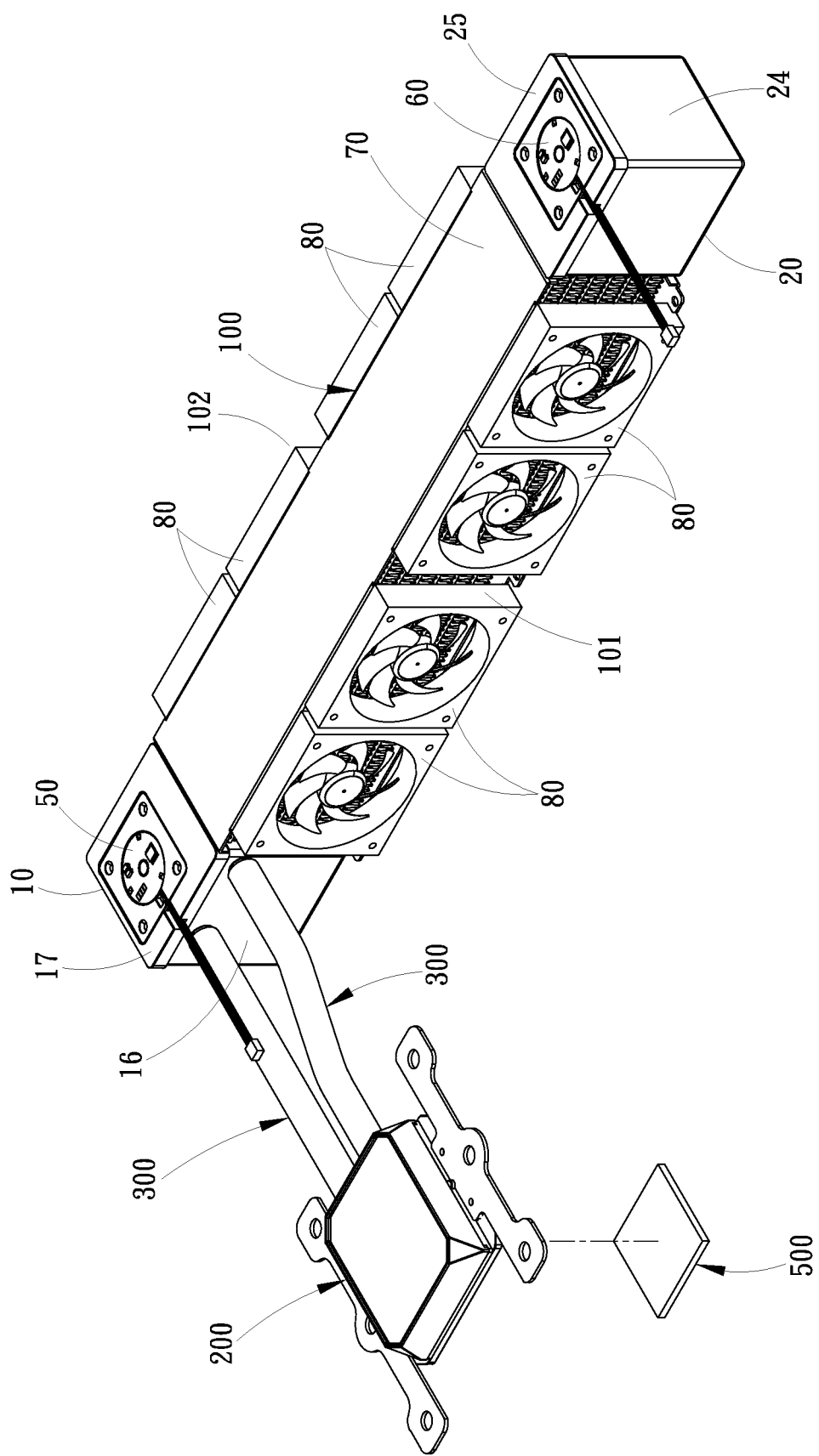
FIG. 2 is a schematic diagram of the combination of the liquid cooling heat dissipation device of the present invention.

As shown in FIG. 1 and FIG. 2, a dual liquid pump liquid cooling radiator 100 of the present invention is used to form a liquid cooling heat dissipation device with a liquid cooling head 200 and two radiator pipes 300. The liquid cooling head 200 is used to stick on a processor 500 for cooling and heat dissipation.

Figure 3:
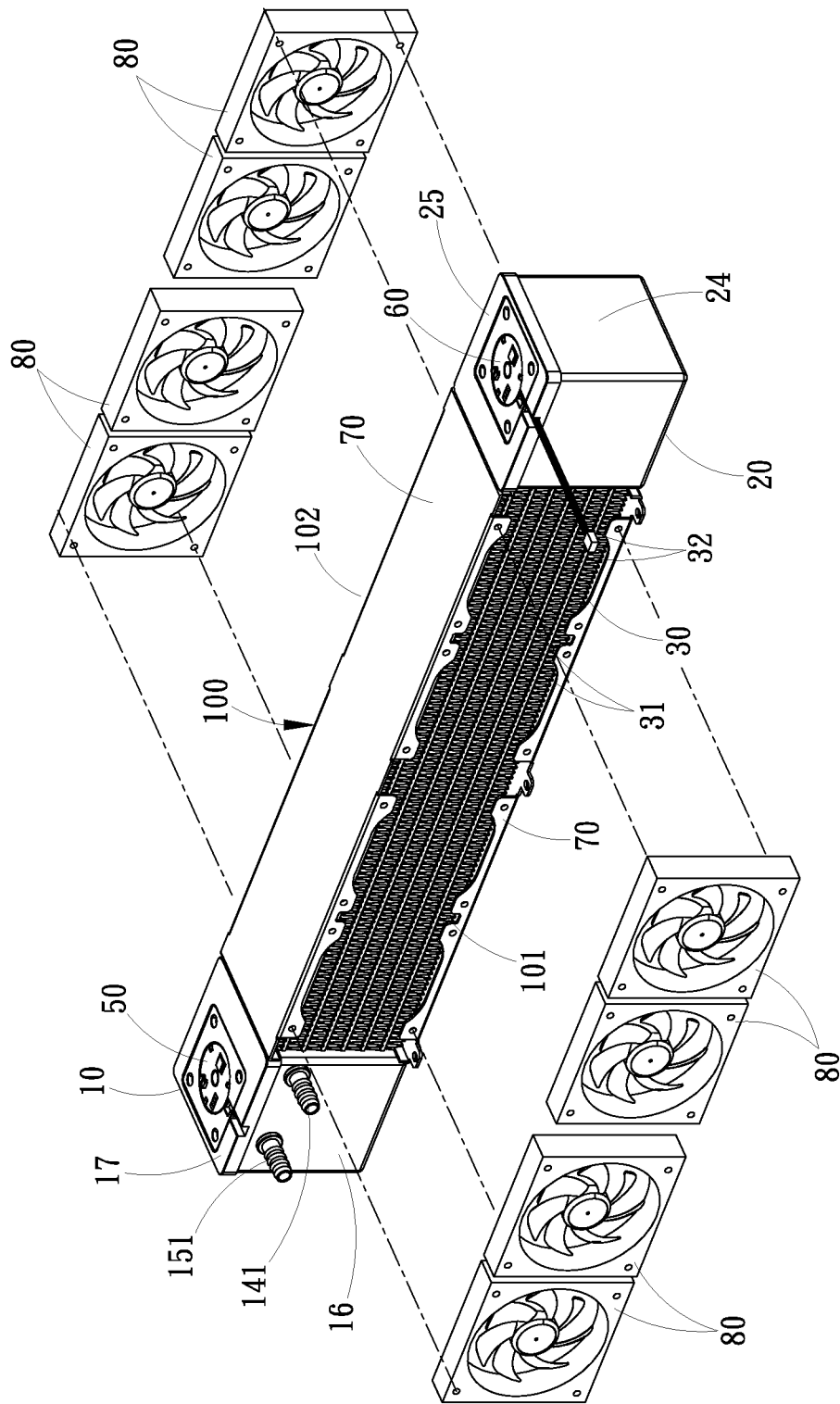
FIG. 3 is the first exploded view of the dual liquid pump liquid cooling radiator of the present invention.
Figure 4:
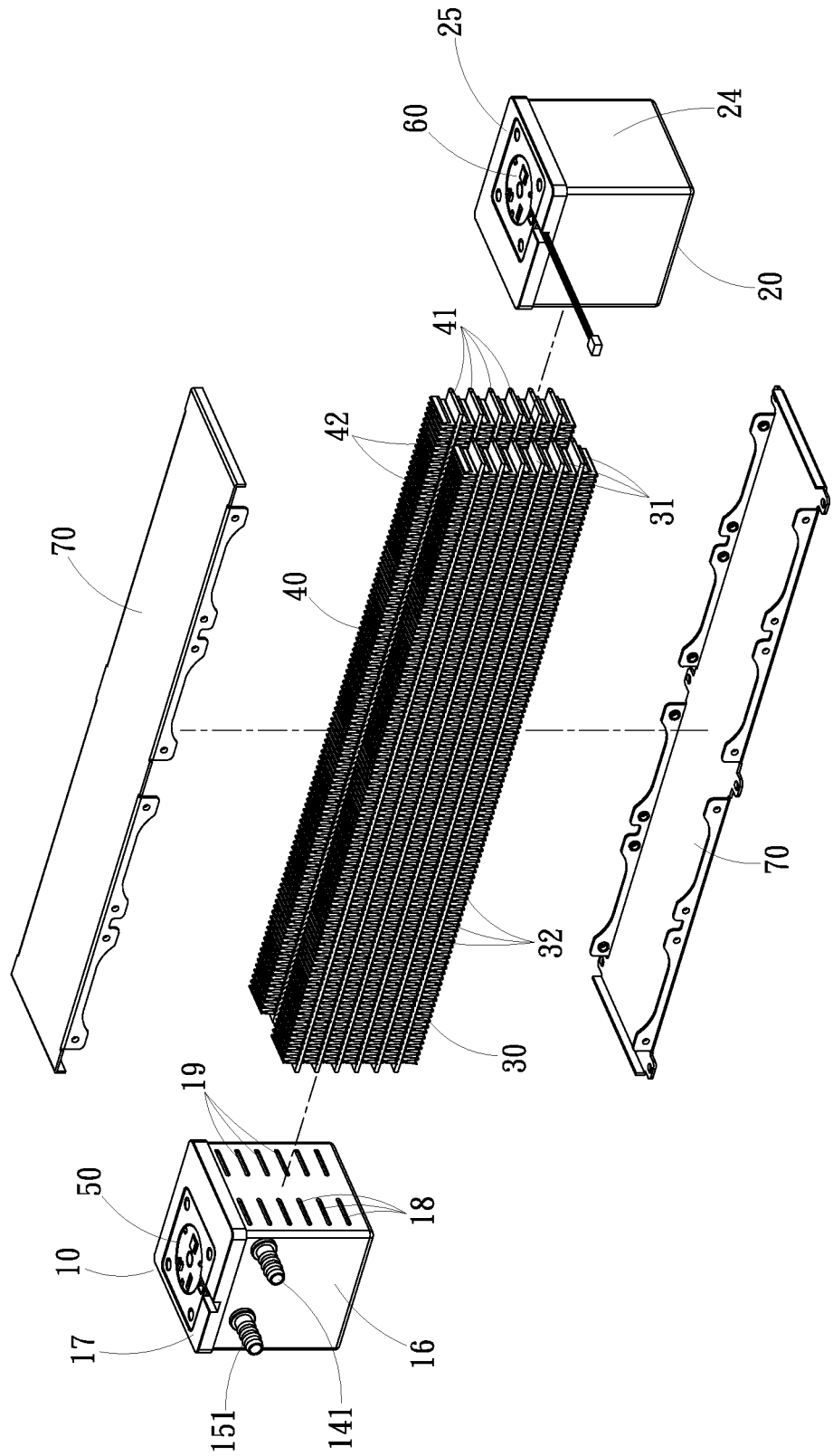
FIG. 4 is the second exploded view of the dual liquid pump liquid cooling radiator of the present invention.

As shown in FIG. 3 to FIG. 4, the preferred embodiment of the dual liquid pump liquid cooling radiator 100 of the present invention comprises a first liquid box 10, a second liquid box 20, and a first radiator pipe set 30 and a second radiator pipe set 40 arranged side by side between the first liquid box 10 and the second liquid box 20. The first radiator pipe set 30 and the second radiator pipe set 40 respectively comprise a plurality of flat pipes 31, 41 arranged at intervals up and down, and heat dissipation fins 32, 42 welded on the upper and lower sides of each of the flat pipes 31, 41. When the first radiator pipe set 30 and the second radiator pipe set 40 are assembled, the first ends of the flat pipes 31 and 41 are respectively connected to the first liquid box 10, and the opposing second ends are respectively connected to the second liquid box 20.

Figure 5:
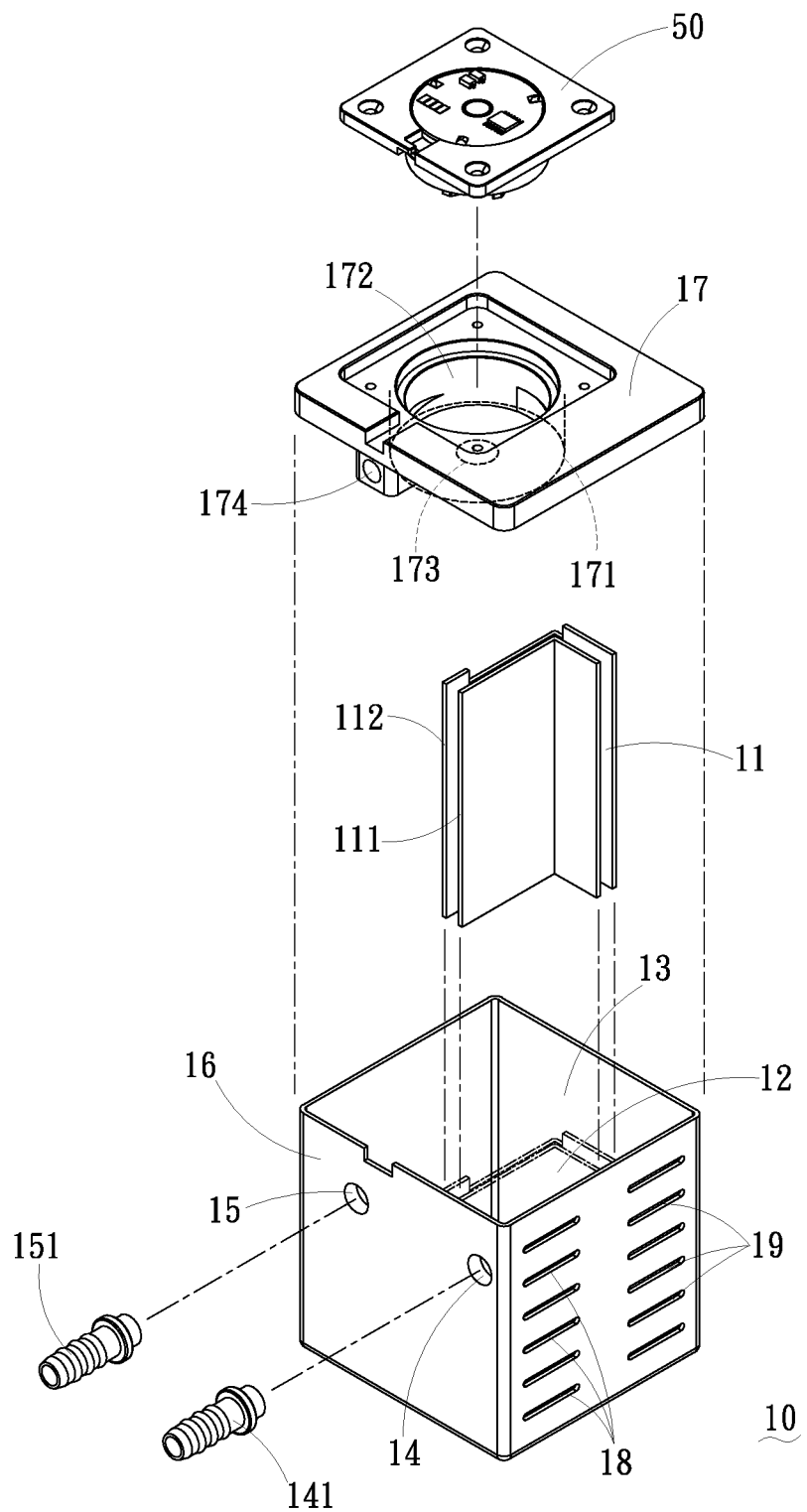
FIG. 5 is an exploded view of the first liquid box of the present invention.
Figure 6:
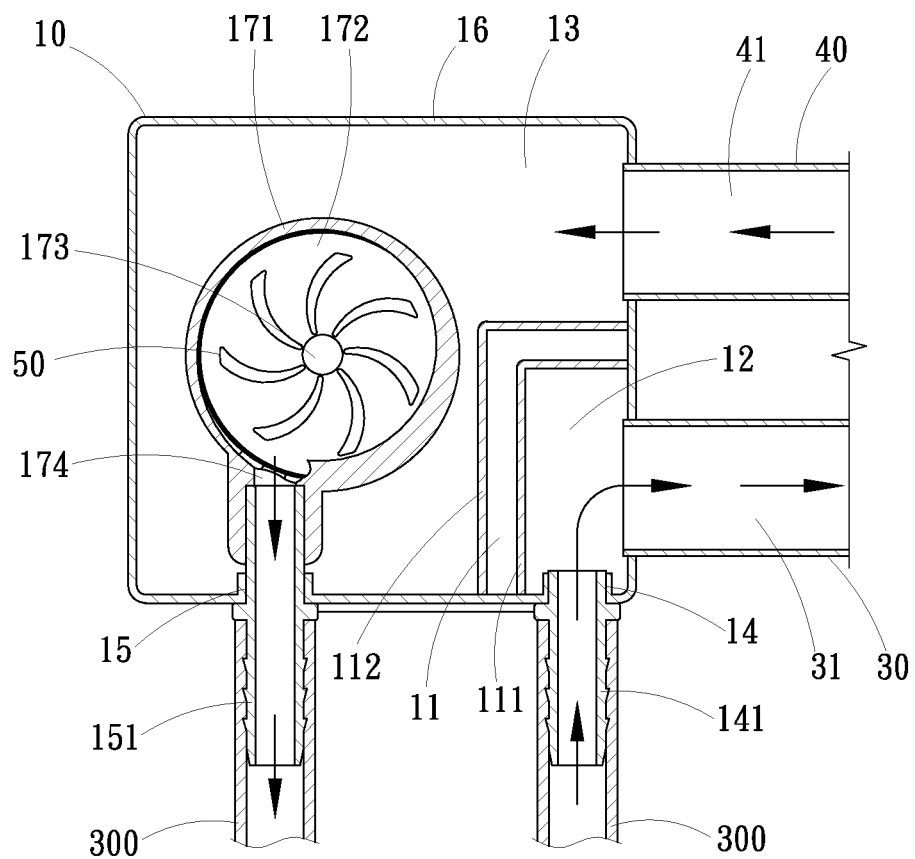
FIG. 6 is a schematic diagram of the action of the first liquid box of the present invention.

As shown in FIG. 5 and FIG. 6, the first liquid box 10 is implemented as a closed metal box with a hollow inside, and an air heat insulation space 11 is provided inside, and the air heat insulation space 11 divides the interior of the first liquid box 10 into a first hot liquid chamber 12 and a first cold liquid chamber 13, and the space of the first hot liquid chamber 12 is smaller than the space of the first cold liquid chamber 13, so that the hot liquid flows into the first hot liquid chamber 12 and then quickly flows into the first radiator pipe set 30, avoiding heat accumulation in the first liquid box 10. The box wall of the first liquid box 10 is provided with a liquid inlet hole 14 communicating with the first hot liquid chamber 12 and a liquid outlet hole 15 communicating with the first cold liquid chamber 13. The first hot liquid chamber 12 or the first cold liquid chamber 13 of the first liquid box 10 is provided with a first liquid pump 50. When the first liquid pump 50 is working, it passes through one of the radiator pipes 300 and the liquid inlet hole 14, so that the heated cooling liquid (hot liquid) in the liquid cooling head 200 flows into the first hot liquid chamber 12, and then flows into the flat pipes 31 of the first radiator pipe set 30, and then flows from the flat pipes 31 to the second liquid box 20. In the process, the first radiator pipe set 30 is used for the first heat dissipation and cooling. When the first liquid pump 50 is working, the coolant in the second liquid box 20 flows to the first cold liquid chamber 13 through the flat pipes 41 of the second radiator pipe set 40, and the second radiator pipe set 40 is used for second heat dissipation and cooling. The cooled cooling liquid (cold liquid) is delivered to the liquid cooling head 200 through the liquid outlet hole 15 and another radiator pipe 300, and then cools the processor 500 above.

Figure 7:
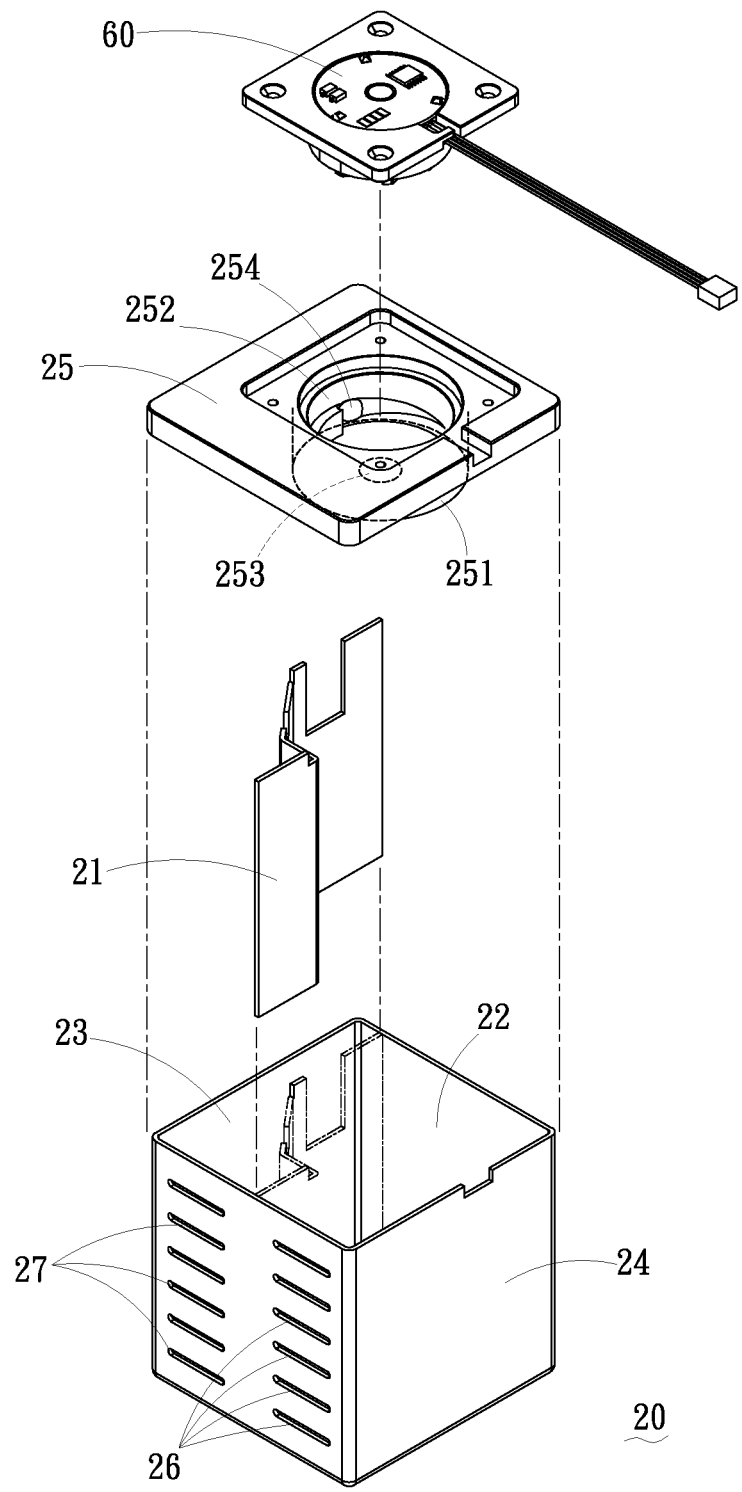
FIG. 7 is an exploded view of the second liquid box of the present invention.
Figure 8:
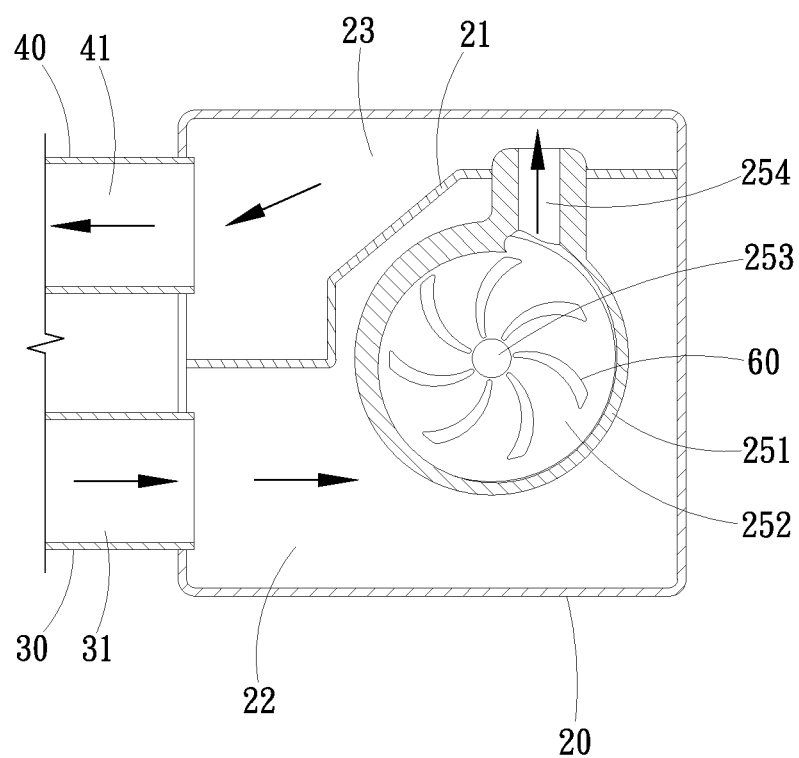
FIG. 8 is a schematic diagram of the action of the second liquid box of the present invention.

As shown in FIG. 7 and FIG. 8, the second liquid box 20 is implemented as a closed metal box with a hollow inside, and a second liquid barrier 21 is arranged inside, and the second liquid barrier 21 divides the interior of the second liquid box 20 into a second hot liquid chamber 22 and a second cold liquid chamber 23. The second hot liquid chamber 22 or the second cold liquid chamber 23 is provided with a second liquid pump 60. When the second liquid pump 60 is working, the cooling liquid (hot liquid cooled for the first time) in the flat pipes 31 of the above-mentioned first radiator pipe set 30 flows into the second hot liquid chamber 22 and then flows into the second cold liquid chamber 23, and the cooling liquid of the second cold liquid chamber 23 flows into the flat pipes 41 of the second radiator pipe set 40, and the second radiator pipe set 40 is used to dissipate heat for the second time to cool down the cooling liquid into cold liquid for flowing to the first cold liquid chamber 13 of the first liquid box 10 above. The present invention utilizes the first liquid pump 50 and the second liquid pump 60 to work synchronously, which can overcome the problems of reduced flow rate and excessive liquid pump load caused by the increase of the radiator pipes, so that the lengths of the first radiator pipe set 30 and the second radiator pipe set 40 can be extended to accommodate more fans 80 arranged side by side.

As shown in FIG. 5 and FIG. 6, the air heat insulation space 11 of the above-mentioned first liquid box 10 is an L-shaped curved space. One end of the air heat insulation space 11 is connected to the inner surface of the front wall of the first liquid box 10, the other end of the air heat insulation space 11 is connected to the inner surface of one side wall of the first liquid box 10, and the bottom of the air heat insulation space 11 The end of the first liquid box is connected to the inner surface of the bottom wall of the first liquid box 10. One of the preferred embodiments, the air heat insulation space 11 comprises a hot liquid bending partition 111 and a cold liquid bending partition 112 arranged at intervals. One ends of the hot liquid bending partition 111 and the cold liquid bending partition 112 are respectively welded to the inner surface of the front wall of the first liquid box 10 between the liquid inlet hole 14 and the liquid outlet hole 15, the other ends are respectively welded to the inner surface of one side wall of the first liquid box 10 between the first radiator pipe set 30 and the second radiator pipe set 40, and the bottoms are respectively welded to the inner surface of the bottom wall of the first liquid box 10, so that the air heat insulation space 11 is located between the hot liquid bending partition 111 and the cold liquid bending partition 112. Since the thermal conductivity of air is 0.025 W/m·K, and the thermal conductivity of aluminum is 237 W/m·K, the air heat insulation space 11 of the present invention can effectively prevent the heat transfer of the hot liquid flowing into the first hot liquid chamber 12 to the cold liquid in the first cold liquid chamber 13, avoiding the cooled cooling liquid from being heated again. This can ensure the cooling efficiency when the cold liquid flows into the liquid cooling head 200.

As shown in FIG. 5 and FIG. 7 together, the above-mentioned first liquid box 10 and second liquid box 20 preferably consist of a box body 16, 24 and a box cover 17, 25 respectively. The box body 16, 24 is a rectangular box body with an upper opening, and the box cover 17, 25 is a rectangular box cover covering the upper opening. The front wall of the box body 16 of the first liquid box 10 is provided with the above-mentioned liquid inlet hole 14 and liquid outlet hole 15, and the liquid inlet hole 14 and the liquid outlet hole 15 are combined with a quick connector 141, 151 respectively. The side wall of the box body 16 of the first liquid box 10 and the side wall of the box body 24 of the second liquid box 20 that correspond to each other are respectively provided with a row of first radiator pipe jacks 18, 26 and a row of second radiator pipe jacks 19, 27, so that the flat pipes 31 and 41 of the first radiator pipe set 30 and the second radiator pipe set 40 can be inserted and welded in the row of first radiator pipe jacks 18, 26 and the row of second radiator pipe jacks 19, 27 respectively.

As shown in FIG. 5 and FIG. 7, in order to install the first liquid pump 50 and the second liquid pump 60, one of the preferred embodiments of the present invention protrudes a liquid pump seat 171, 251 on the inner surface of each box cover 17, 25, and a liquid pump cavity 172, 252 is recessed on the outer surface of each box cover 17, 25 and extending to the liquid pump seat 171, 251. Set the first liquid pump 50 above to the liquid pump cavity 172, and the second liquid pump 60 to the other liquid pump cavity 252. The liquid pump cavity 171 has a first inlet 173 and a first outlet 174 inside. The first inlet 173 is connected to the first cold liquid chamber 13, and the first outlet 174 is connected to the quick connector 151 in the liquid outlet hole 15. The other liquid pump cavity 252 is provided with a second inlet 253 and a second outlet 254, so that the second inlet 253 is connected to the second hot liquid chamber 22, and the second outlet 254 is connected to the second cold liquid chamber 23.

As shown in FIG. 2 and FIG. 3, the preferred embodiment of the dual liquid pump liquid cooling radiator 100 of the present invention is further implemented with two fan racks 70 and a plurality of fans 80. The two fan racks 70 are metal plates covering the upper and lower sides of the first radiator pipe set 30 and the second radiator pipe set 40 respectively, so that the dual liquid pump liquid cooling radiator 100 forms an air inlet end 101 and an air outlet end 102. The air inlet end 101 is located between the front walls of the first liquid box 10 and the second liquid box 20, and the air outlet end 102 is located between the rear walls of the first liquid box 10 and the second liquid box 20. The plurality of fans 80 are fixed side by side between the two fan racks 70 of the air inlet end 101 and/or the air outlet end 102 to make cold air flow from the air inlet end 101 through the heat dissipation fins 32, 42 and them flow out to the air outlet end 102 so as to cool down the cooling liquid circulating in the first radiator pipe set 30 and the second radiator pipe set 40.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A dual liquid pump liquid cooling radiator, comprising a first liquid box, second liquid box, first radiator pipe set and a second radiator pipe set, wherein:

said first radiator pipe set and said second radiator pipe set are arranged side by side between said first liquid box and said second liquid box, said first radiator pipe set and said second radiator pipe set respectively comprising a plurality of flat pipes arranged at intervals up and down and a plurality of heat dissipation fins welded on upper and lower sides of each said flat pipe, said flat pipes each having a first end thereof respectively connected to said first liquid box and an opposing second end thereof respectively connected to said second liquid box;

said first liquid box comprises an air heat insulation space therein to divide the interior of said first liquid box into a first hot liquid chamber and a first cold liquid chamber where the space of said first hot liquid chamber is smaller than the space of said first cold liquid chamber, a liquid inlet hole connected to said first hot liquid chamber, a liquid outlet hole connected to said first cold liquid chamber, and a first liquid pump set therein for making a cooling liquid flow from said liquid inlet hole through said first hot liquid chamber, then flow into the flat pipes of said first radiator pipe set, and flow to said second liquid box through the flat pipes of said first radiator pipe set, so that the said cooling liquid flowing into said second liquid box flows to said first cold liquid chamber through the flat pipes of said second radiator pipe set and then flow out of said liquid outlet hole;

said second liquid box comprises a second liquid barrier therein to divide the interior of said second liquid box into a second hot liquid chamber and a second cold liquid chamber and a second liquid pump set therein for making the said cooling liquid in the flat pipes of said first radiator pipe set flow into said second hot liquid chamber and then flow into said second cold liquid chamber, and for making the said cooling liquid in said second cold liquid chamber flow into the flat pipes of said second radiator pipe set box and then flow to said first cold liquid chamber of said first liquid box.

2. The dual liquid pump liquid cooling radiator as claimed in claim 1, wherein said first liquid pump is located in said first cold liquid chamber; said second liquid pump is located in said second cold liquid chamber.

3. The dual liquid pump liquid cooling radiator as claimed in claim 2, wherein said air heat insulation space is a curved space, said air heat insulation space having one end thereof connected to an inner surface of a front wall of said first liquid box, an opposite end thereof connected to an inner surface of one side wall of said first liquid box and a bottom thereof connected to an inner surface of a bottom wall of said first liquid box.

4. The dual liquid pump liquid cooling radiator as claimed in claim 1, wherein said first liquid box and said second liquid box respectively comprise a box body and a box cover, said box body being a rectangular box body with an upper opening and said box cover being a rectangular box cover covering said upper opening; said liquid inlet hole and said liquid outlet hole are located on a front wall of the box body of said first liquid box and respectively combined with a quick connector; the box body of the said first liquid box and the box body of the said second liquid box are respectively provided with a row of first radiator pipe jacks and a row of second radiator pipe jacks on respective side walls thereof; the flat pipes of said first radiator pipe set and said second radiator pipe set are respectively inserted into said first radiator pipe jacks and said second radiator pipe jacks.

5. The dual liquid pump liquid cooling radiator as claimed in claim 4, wherein said air heat insulation space comprises a hot liquid bending partition and a cold liquid bending partition arranged at intervals, said hot liquid bending partition and said cold liquid bending partition each having one end thereof respectively welded to an inner surface of the front wall of said first liquid box between said liquid inlet hole and said liquid outlet hole, an opposite end thereof respectively welded to an inner surface of one side wall of said first liquid box between said first radiator pipe jacks and said second radiator pipe jacks an a bottom thereof respectively welded to an inner surface of a bottom of said first liquid box, so that said air heat insulation space is located between said hot liquid bending partition and said cold liquid bending partition.

6. The dual liquid pump liquid cooling radiator as claimed in claim 4, wherein said box cover comprises a liquid pump seat protruding from an inner side thereof, and a liquid pump cavity recessed on an opposing outer side thereof and extending to said liquid pump seat; said first liquid pump is set in the liquid pump cavity of the box cover of said first liquid box; said second liquid pump is set in the liquid pump cavity of the box cover of said second liquid box; the liquid pump cavity of said first liquid box is provided with a first inlet connected to said first cold liquid chamber and a first outlet connected to the quick connector of said liquid outlet hole; the liquid pump cavity of said second liquid box is provided with a second inlet connected to said second cold liquid chamber and a second outlet connected to said second cold liquid chamber.

7. The dual liquid pump liquid cooling radiator as claimed in claim 1, further comprising two fan racks and a plurality of fans, said two fan racks covering opposing upper and lower sides of said first radiator pipe set and said second radiator pipe set respectively to form an air inlet end and an air outlet end, said fans being fixed side by side between said two fan racks of said air inlet end and/or said air outlet end.

8. A liquid cooling heat dissipation device, comprising a dual liquid pump liquid cooling radiator, a liquid cooling head and two radiator pipes, wherein:

said dual liquid pump liquid cooling radiator comprising a first liquid box, second liquid box, first radiator pipe set and a second radiator pipe set;

said first radiator pipe set and said second radiator pipe set are arranged side by side between said first liquid box and said second liquid box, said first radiator pipe set and said second radiator pipe set respectively comprising a plurality of flat pipes arranged at intervals up and down and a plurality of heat dissipation fins welded on upper and lower sides of each said flat pipe, said flat pipes each having a first end thereof respectively connected to said first liquid box and an opposing second end thereof respectively connected to said second liquid box;

said first liquid box comprises an air heat insulation space therein to divide the interior of said first liquid box into a first hot liquid chamber and a first cold liquid chamber where the space of said first hot liquid chamber is smaller than the space of said first cold liquid chamber, a liquid inlet hole connected to said first hot liquid chamber, a liquid outlet hole connected to said first cold liquid chamber, and a first liquid pump set therein for making a cooling liquid flow from said liquid inlet hole through said first hot liquid chamber, then flow into the flat pipes of e said first radiator pipe set, and flow to said second liquid box through the flat pipes of said first radiator pipe set, so that the said cooling liquid flowing into said second liquid box flows to said first cold liquid chamber through the flat pipes of said second radiator pipe set and then flow out of said liquid outlet hole;

said second liquid box comprises a second liquid barrier therein to divide the interior of said second liquid box into a second hot liquid chamber and a second cold liquid chamber and a second liquid pump set therein for making the said cooling liquid in the flat pipes of said first radiator pipe set flow into said second hot liquid chamber and then flow into said second cold liquid chamber, and for making the said cooling liquid in said second cold liquid chamber flow into the flat pipes of said second radiator pipe set box and then flow to said first cold liquid chamber of said first liquid box;

said liquid cooling head is used for stick to the surface of a processor; said two radiator pipes each have a respective one end thereof respectively connected to said liquid cooling head, and a respective opposite end thereof respectively connected to respective quick connectors in said liquid inlet hole and said liquid outlet hole of the box body of said first liquid box.

* * * * *